United States Patent [19]

McKibben et al.

[11] Patent Number: 4,864,167
[45] Date of Patent: Sep. 5, 1989

[54] DUAL FUNCTION PEAK METERING CIRCUIT

[75] Inventors: Barry A. McKibben, Beaverton; Edward J. Cleary, Jr., Aloha, both of Oreg.

[73] Assignee: Tektronix, Inc., Beaverton, Oreg.

[21] Appl. No.: 227,028

[22] Filed: Aug. 1, 1988

[51] Int. Cl.⁴ .............................................. H03K 5/08
[52] U.S. Cl. .................................. 307/549; 307/351; 307/358; 307/551
[58] Field of Search ............... 307/350, 351, 358, 542, 307/549, 551, 555, 562; 455/308, 309, 116; 358/36, 156, 167, 175, 177

[56] References Cited

U.S. PATENT DOCUMENTS

| | | | |
|---|---|---|---|
| 3,344,284 | 9/1967 | Thompson | 307/542 |
| 3,541,459 | 11/1970 | Webb | 307/542 |
| 3,804,979 | 4/1974 | Knowles | 307/358 |
| 4,166,924 | 9/1979 | Berkley et al. | 307/540 |
| 4,175,252 | 11/1979 | Shinoda | 307/351 |
| 4,197,505 | 4/1980 | Nishijima et al. | 307/542 |
| 4,460,871 | 7/1984 | Orban | 307/358 |
| 4,736,163 | 4/1988 | Berkhout et al. | 307/350 |

Primary Examiner—John Zazworsky
Attorney, Agent, or Firm—Francis I. Gray

[57] ABSTRACT

A dual function peak metering circuit provides both monitoring and measuring functions for a composite signal having both modulated and unmodulated components. A full-wave rectified version of the composite signal is input to an envelope detector that drives a peak weighting circuit and a variable limiter. The output of the peak weighting circuit controls a threshold level for the variable limiter. The peaks of the signal at the output of the variable limiter are detected with an instantaneous peak-hold circuit that is periodically sampled and reset under microprocessor control. The microprocessor then displays the sampled value both graphically and numerically.

7 Claims, 6 Drawing Sheets

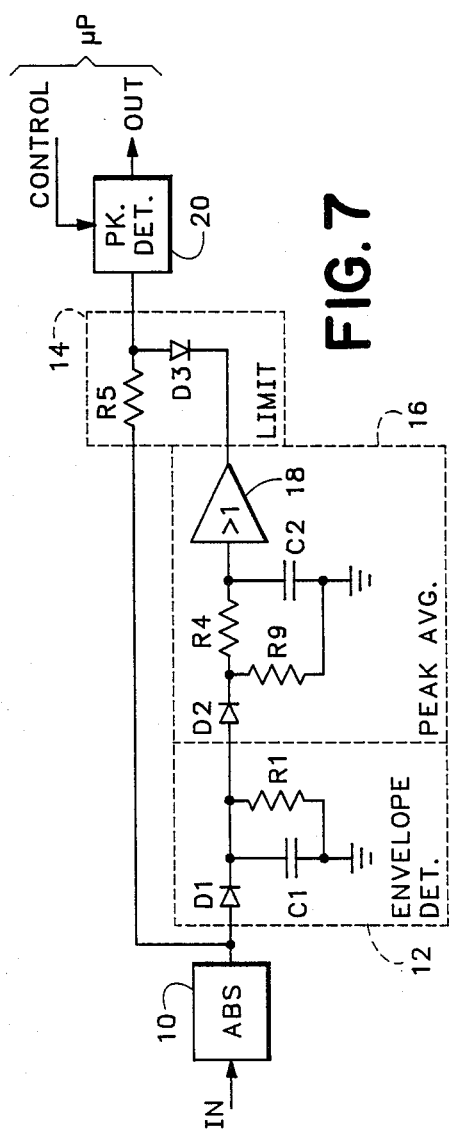
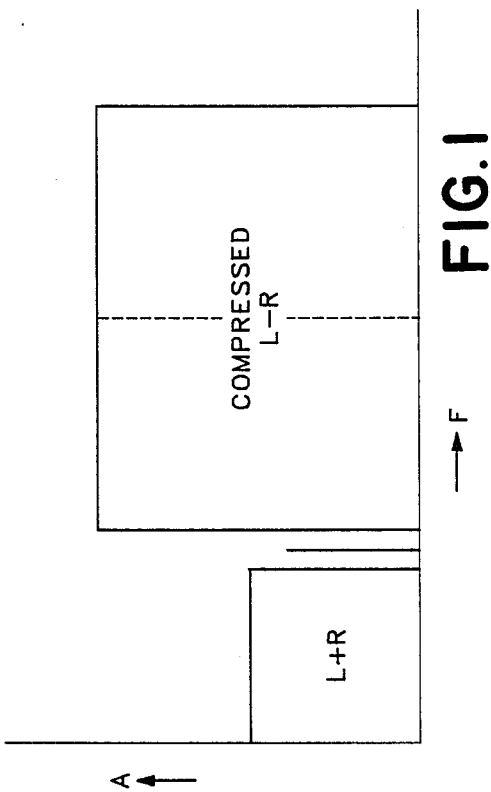

DUAL FUNCTION PEAK METERING CIRCUIT

BACKGROUND OF THE INVENTION

The present invention relates to peak metering circuits, and more particularly to a dual function peak metering circuit for performing both monitoring and measuring functions in the presence of an input signal having both a modulated subcarrier component and an unmodulated baseband component. A peak metering circuit is used to determine peak signal levels for an input signal, and is used in various types of equipment, such as the 751 BTSC Aural Modulation Monitor/Decoder manufactured by Tektronix, Inc. of Beaverton, Oreg. Knowledge of peak levels is necessary for the two basic functions, monitoring and measuring, that put differing requirements on the peak metering circuit. Monitoring requires that the peak indication be weighted or lowpass filtered to ignore peaks that are of no informational consequence. Measuring requires that peak levels be quickly and accurately indicated in order to evaluate the response of the input signal source to test signals. An additional requirement of both functions is that response to modulated subcarrier components of the input signal be the same as response to unmodulated baseband components.

An example of a signal having multiple signal components is a BTSC (Broadcast Television Systems Committee) multi-channel television sound (MTS) signal that contains unmodulated, amplitude modulated and frequency modulated components in a bandwidth of zero to 120 kHz. An amplitude versus frequency graph of such a signal is shown in FIG. 1 where an L+R component is unmodulated, a pilot signal is unmodulated and an L−R component is suppressed carrier amplitude modulated. The resulting composite signal is shown in FIG. 2, with the L−R component shown separately in FIG. 3. As a result of BTSC specified companding time constants and filter ringing, the composite signal shows short duration transient artifacts. As shown in FIG. 4 when an audio burst test signal is input to such a system, the output composite signal has an artifact at the lead end that exceeds the steady state peak value. It is desired to ignore the peak value of the artifact but still correctly measure the peak of the steady state signal. Peak detectors with long time constants can successfully ignore the artifacts, but require a long time to settle to the steady sate value. Also, the indication for a modulated signal, as shown in FIG. 5, is less than that for an unmodulated signal, as shown in FIG. 6. This is because there is less energy in the peaks of the modulated burst. Finally, the indicated peak value is a weighted average of past peaks and hardly ever a true value for any actual peak due to the exponential nature of the capacitor charging required to replace the charge drained between peaks.

What is desired is a dual function peak metering circuit that satisfies both the monitoring and measuring functions for composite signals having both modulated and unmodulated components.

SUMMARY OF THE INVENTION

Accordingly the present invention provides a dual function peak metering circuit that provides both monitoring and measuring functions for a composite signal having both modulated and unmodulated components. A full-wave rectified, or absolute value, version of the composite signal is input to an envelope detector that drives a peak weighting circuit and a variable limiter. The output of the peak weighting circuit controls a limiting level for the variable limiter. The peaks of the signal at the output of the variable limiter are detected with an instantaneous peak-hold circuit that is periodically sampled and reset under microprocessor control. The microprocessor then displays the sampled value both graphically and numerically.

The objects, advantages and novel features of the present invention are apparent from the following detailed description when read in conjunction with the appended claims and attached drawing.

BRIEF DESCRIPTION OF THE DRAWING

FIG. 1 is a plot of amplitude versus frequency for a composite signal (BTSC) having both unmodulated and modulated components.

FIG. 7 is a conceptual schematic diagram for a dual function peak metering circuit according to the present invention.

DESCRIPTION OF THE PREFERRED EMBODIMENT

Figure 2:
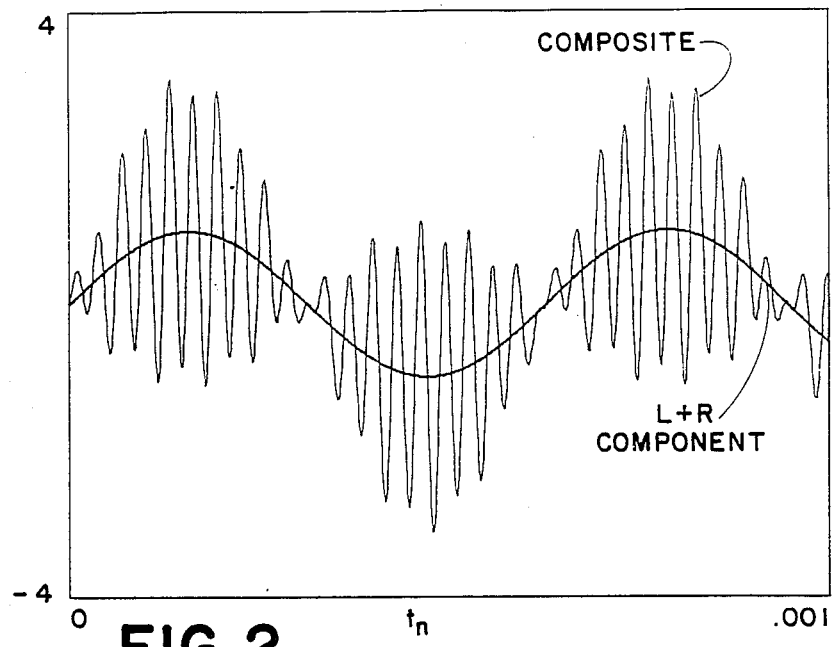
FIG. 2 is a graph of a composite signal according to FIG. 1.
Figure 3:
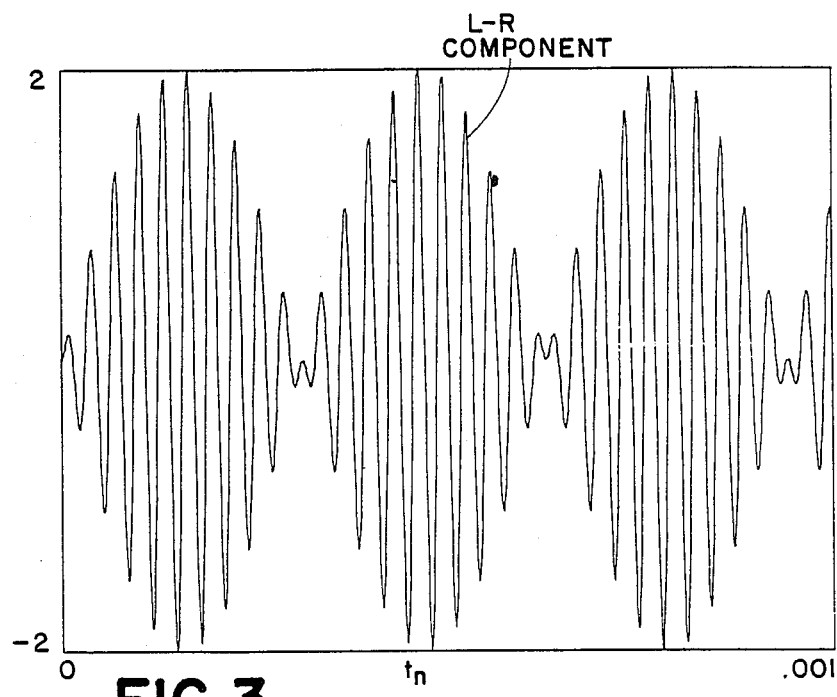
FIG. 3 is a graph of the modulated component of the composite signal of FIG. 2.

Referring now to FIG. 7 a composite signal input to an absolute value circuit 10, such as a full-wave rectifier, to produce a positive input signal. The positive input signal is input to an envelope detector 12 and to a limiter circuit 14. The envelope detector 12 has an "ideal" diode D1 and an PC circuit R1C1. The R1C1 discharge time constant is fast compared to the envelope of the composite signal, but slow with respect to the subcarrier. The output of the envelope detector 12 is input to a peak weighting circuit 16 having an "ideal" diode D2, a lowpass filter R4C2 and an output amplifier 18. The peak weighting circuit 16 is conventional except that the output amplifier 18 has a gain slightly greater than one and its output is not measured directly. The output of the peak weighting circuit 16 is input as a threshold control signal to the limited circuit 14. The limiter circuit 14 has an input resistor R5 to which the positive input signal is applied and an "ideal" diode D3 to which the threshold control signal is applied. The resulting output is taken from the junction of the resistor R5 and diode D3 and input to an instantaneous peak detector circuit 20. The sampling of the instantaneous peak detector circuit 20 is controlled by a microprocessor (not shown), and the microprocessor displays the resulting output both graphically and numerically.

Figure 8:
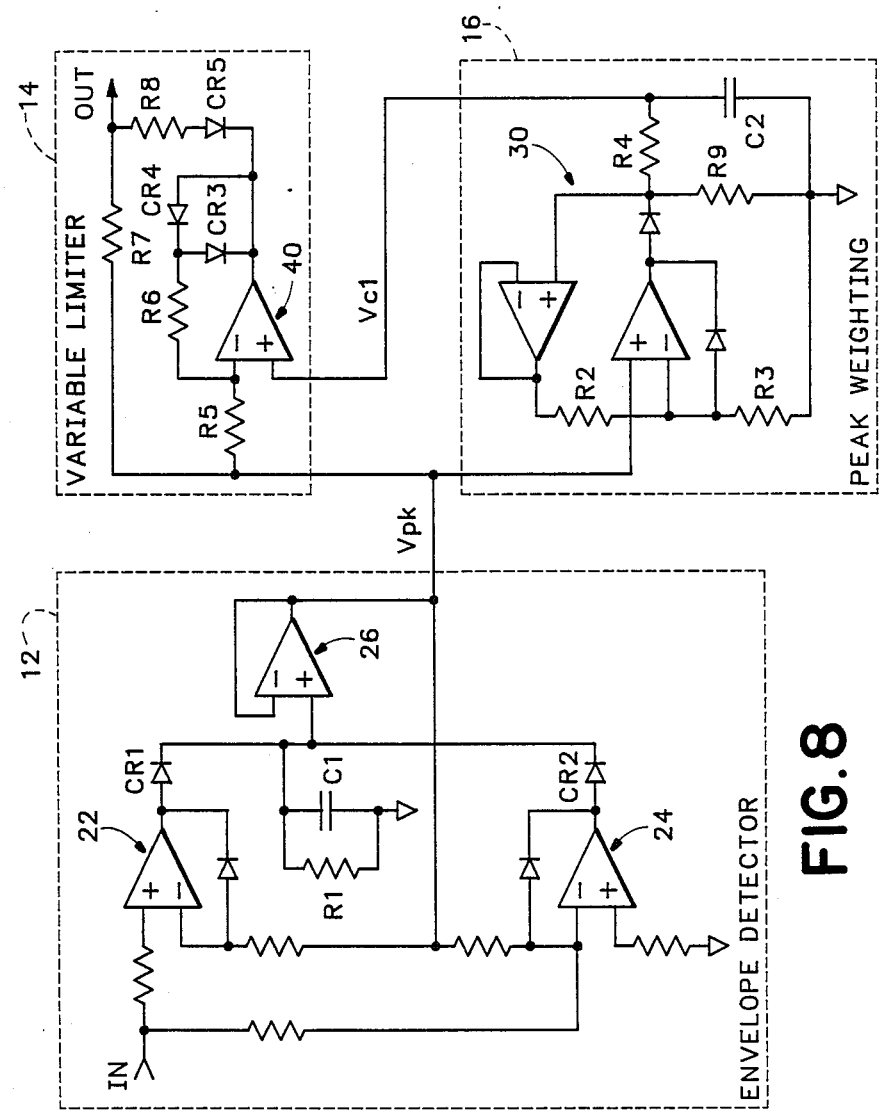
FIG. 8 is a practical schematic diagram for the dual function peak metering circuit of FIG. 7.

As shown in greater detail in FIG. 8 the ideal diodes D1, D2, D3 are combinations of an operational amplifier and diodes to compensate for diode voltage drops. The composite signal is coupled to opposite terminals of respective operational amplifier circuits 22 and 24, each operational amplifier having a feedback diode between the output terminal and the negative input terminal. The outputs of the OP AMP circuits 22, 24 are coupled respectively through diodes CR1 and CR2 to charge capacitor C1, thus tracking the instantaneous peaks of the input signal. The discharge time constant through resistor R1 is long compared with the period of any of the subcarriers present in the composite signal so that the subcarrier envelope is correctly detected and added with equal weight to any low frequency signals present, i.e., response to modulated signals is the same as to unmodulated signals. The charge on the capacitor C1 is coupled to the peak weighting and limiter circuits 14, 16 by a buffer amplifier circuit 26, and also fed back to the negative input terminals of the OP AMP circuits 22, 24. The envelope detector 12 thus acts also as a precision rectifier, providing an envelope of the absolute value of the composite signal.

The peak weighting circuit 16 has an operational amplifier circuit 30 that acts as an "ideal" diode to which the output of the envelope detector is input. The gain of the OP AMP circuit 30 is a value slightly greater than one. The OP AMP circuit 30 is followed by a holding capacitor C2 with controlled charge and discharge time constants determined by resistors R4 and R9, respectively. The gain of the OP AMP circuit 30 is determined by (R2+R3)/R3. The capacitor C2 charge time constant is R4C2 and determines the delay, or "attack time"), required before a peak is no longer clipped by the limiter circuit 14, the charge on the capacitor determining the threshold control signal for the limiter circuit. This satisfies the requirement that short duration peaks be ignored. Since the gain of the OP AMP circuit 30 is greater than one, capacitor C2 charges to a level greater than the level of the average peaks from the envelope detector 12. This puts the threshold control signal, or clipping level, of the limiter circuit 14 above the peak level so that peaks near the average peak level are passed through unaffected, fulfilling the measurement requirement that peaks be accurately indicated. For a gain of 1.2 only 1.6 time constants are required before the clip level exceeds the average peak level.

The output of the envelope detector 12 and the clip level from the peak weighting circuit 16 are input to an inverting amplifier circuit 40. The output of the variable limiter 14 provides a unity gain for input signals from the envelope detector 12 that are less than the clip level from the peak weighting circuit, and zero gain for signals greater than the clip level. If Vcl is the clip level and Vpk is the signal from the envelope detector 12, and with ideal diodes for CR3, CR4, CR5, the output of the inverter circuit 40 is 2*Vcl-Vpk. Since resistors R7 and R8 are equal, this output precisely cancels Vpk at the output junction of these resistors whenever CR5 is forward biased, i.e., when Vpk>Vcl. If CR3 and CR5 are matched and R5=R6=R7=R8, then equal currents flow in CR3 and CR5 so their voltage drops cancel. CR4 provides feedback to the OP AMP circuit 40 when CR3 and CR5 are reverse biased to prevent overdrive recovery from delaying the clipping action.

Figure 4:
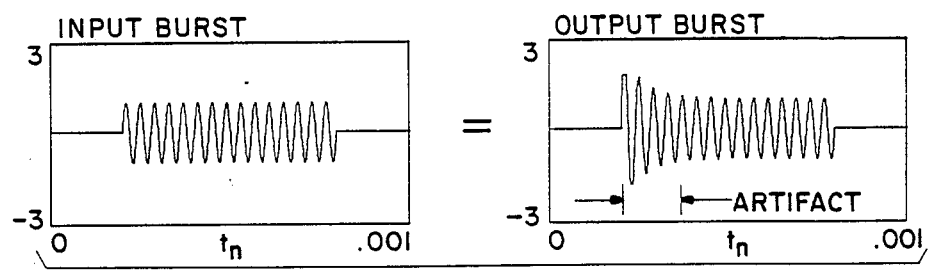
FIG. 4 is a graph illustrating the distortion of an input audio burst test signal due to processing of the composite signal.
Figure 5:
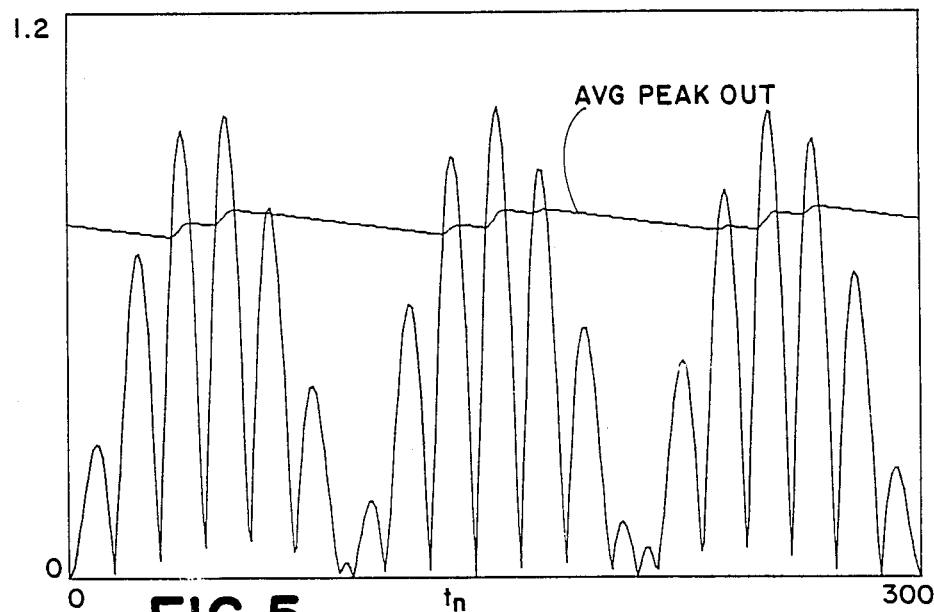
FIG. 5 is a graph illustrating the reaction of a peak averaging circuit to a modulated signal.
Figure 6:
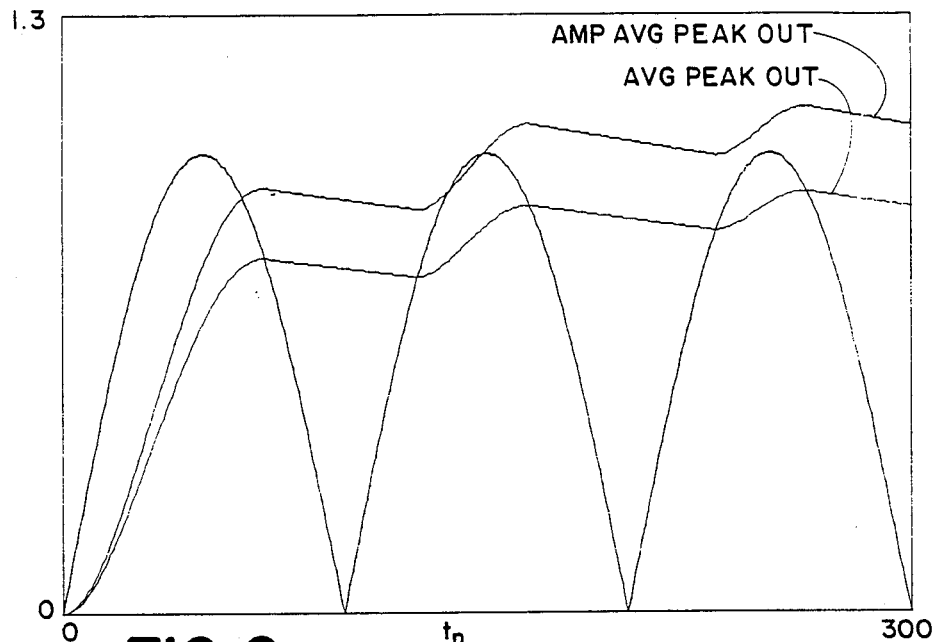
FIG. 6 is a graph illustrating the reaction of a peak averaging circuit with and without gain to an unmodulated signal.
Figure 9:
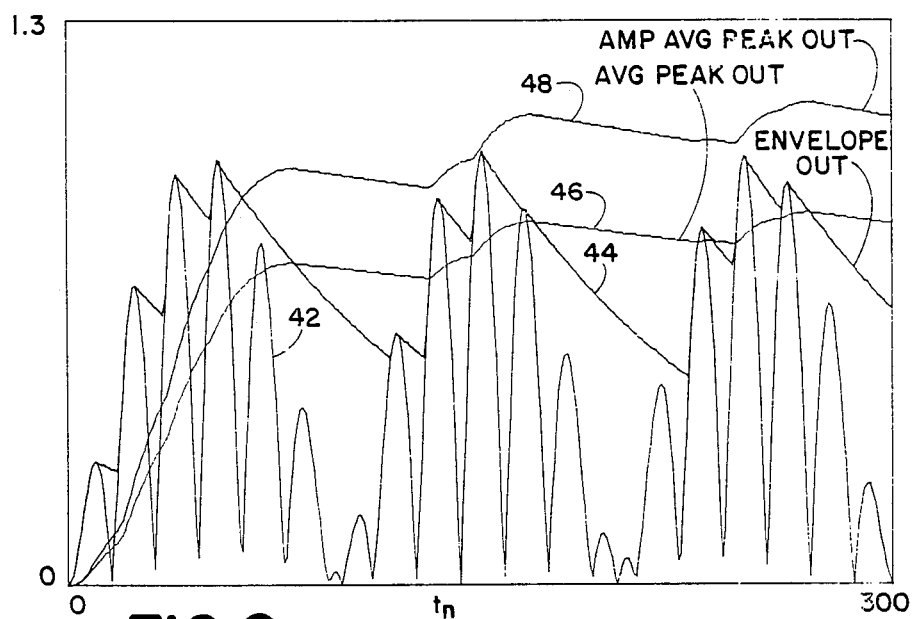
FIG. 9 is a graph illustrating the outputs of various portions of the circuit of FIG. 7 having a modulated signal as an input.
Figure 11:
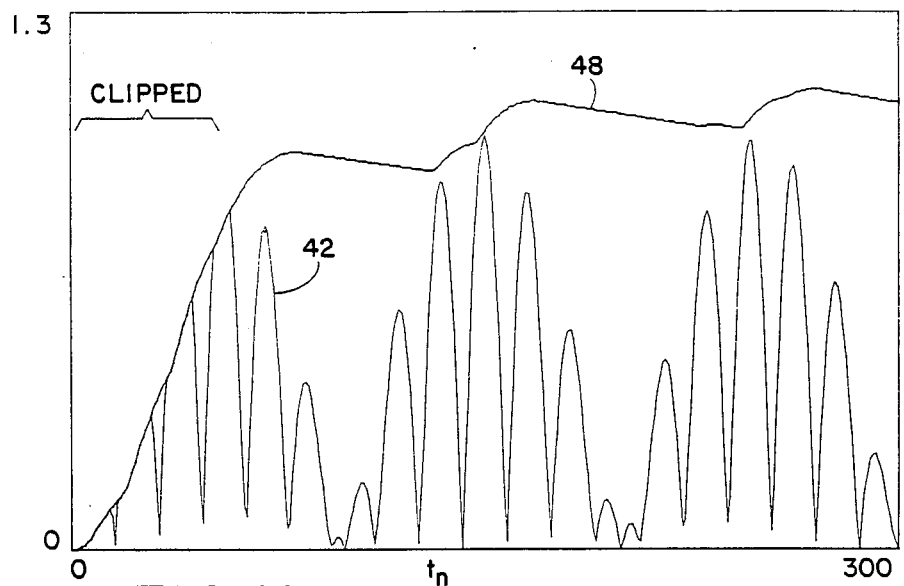
FIG. 11 is a graph illustrating the operation of the circuit of FIG. 7 upon a modulated signal.
Figure 10:
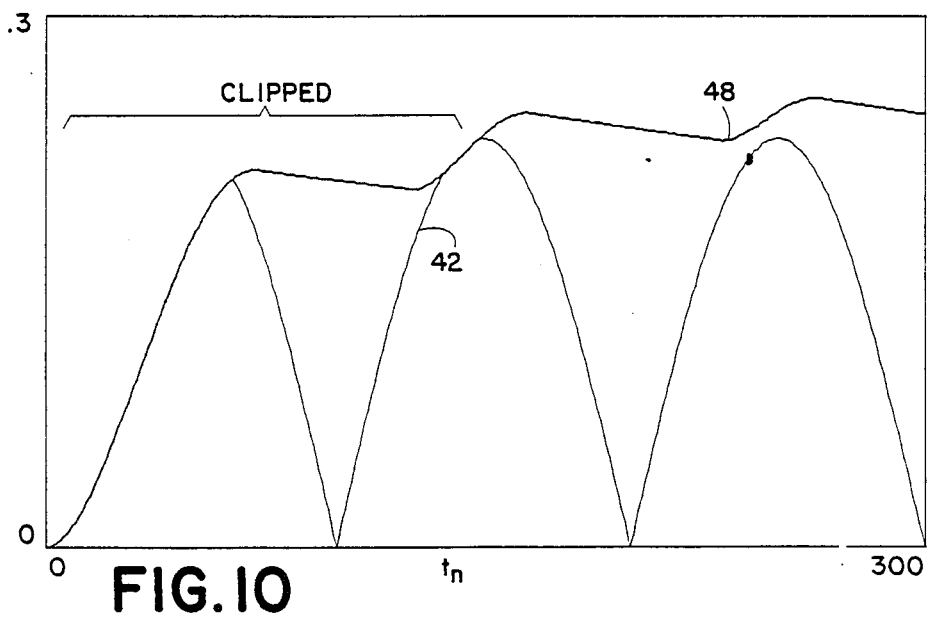
FIG. 10 is a graph illustrating the operation of the circuit of FIG. 7 upon an unmodulated signal.

Referring to FIGS. 9-11 the operation of the circuits of FIGS. 7 and 8 is illustrated. FIG. 9 illustrates a modulated signal 42 that is part of the composite signal input to the envelope detector 12. The output of the envelope detector 12 is shown by the heavy line 44 labeled ENVELOPE OUT. ENVELOPE OUT is input to the peak weighting circuit 16 and the output of the peak weighting circuit without amplification is a dotted line 46 labeled AVG PK OUT. The second dotted line 48, labeled AMPLIFIED AV PK OUT, indicates the output from the actual peak weighting circuit 16 with amplification. As can be seen the amplified average peak value quickly reaches a value slightly greater than any peaks of the composite signal so that actual peak values are passed through the limiter circuit 14 for detection by the instantaneous peak detector 20. Any anomalous peaks substantially above the normal peaks of the composite signal would be clipped at the amplified average pea output value since such a signal would bias the diode D3/CR5 on. FIGS. 10 and 11 illustrate the actual output from the limiter circuit 14 for an unmodulated component and a modulated component, respectively, of the composite signal. As can be seen the first few cycles are clipped until the amplified average peak output exceeds the normal peak values of the signal. This would correspond to the artifact region of the test signal shown in FIG. 4. In fact since the artifact region has more energy than the actual test signal, the amplified average peak output reaches a level above the normal peaks slightly quicker than if the actual burst signal was input to the peak monitoring circuit.

Thus the present invention provides a dual function peak metering circuit for both monitoring and measuring a composite signal having both modulated and unmodulated components by using an envelope detector ahead of a peak weighting circuit to give uniform response to both modulated and unmodulated components, by using a gain greater than one in the peak weighting circuit to prevent corruption of peaks near the average peak level and to arrive at the point of accurate peak indication faster, and by using a variable limiter that cancels a non-inverted signal with an inverted copy of that signal whenever the signal exceeds a threshold to eliminate transient amplitude spikes.

What is claimed is:

1. An dual function peak metering circuit comprising:
    means for detecting an envelope of a composite signal having both a modulated component and an unmodulated component to produce an envelope signal;
    means for generating an enhanced weighted average of the envelope signal to produce a clip signal having a level greater than normal peaks of the composite signal; and
    means for limiting the envelope signal when the envelope signal exceeds the clip signal.

2. A dual function peak metering circuit as recited in claim 1 wherein the generating means comprises:
    means for averaging the envelope signal to produce an average peak signal; and
    means for amplifying the average peak signal by a factor greater than one to produce the clip signal having a value greater than normal peak values of the composite signal.

3. A dual function peak metering circuit as recited in claim 1 further comprising:

means for obtaining an absolute value signal from the composite signal for input to the detecting means; and means for instantaneously detecting the peaks of the envelope signal at the output of the limiting means.

4. A dual function peak metering circuit as recited in claim 1 wherein the detecting means comprises means for storing energy from the composite signal instantaneously in response to the highest frequency components in the composite signal, and for discharging the stored energy with a time constant fast with respect the lowest frequency components of the composite signal and slow with respect to the highest frequency components, the output of the storing and discharging means being the envelope signal.

5. A dual function peak metering circuit as recited in claim 1 wherein the limiting means comprises:

means for combining the envelope signal with the clip signal to produce a limit signal; and means for subtracting the envelope signal from the limit signal when the envelope signal is greater than the clip signal so that the envelope signal is limited to a value o greater than the value of the clip signal.

6. A dual function peak metering circuit as recited in claim 5 wherein the combining means comprises an inverting amplifier having as inputs the clip signal and the envelope signal to produce the limit signal.

7. A dual function peak metering circuit as recited in claim 5 wherein the subtracting means comprises a diode connected between the output of the limiting means and the output of the combining means so that when the envelope signal exceeds the clip signal the diode conducts to limit the envelope signal at the output of the limiting means to the value of the clip signal.

* * * * *